United States Patent
Park

(10) Patent No.: US 9,419,530 B2
(45) Date of Patent: Aug. 16, 2016

(54) POWER ESTIMATION DEVICE USING COAXIAL WINDING TRANSFORMER

(71) Applicant: SOONGSIL UNIVERSITY RESEARCH CONSORTIUM TECHNO-PARK, Seoul (KR)

(72) Inventor: Joung Hu Park, Seoul (KR)

(73) Assignee: SOONGSIL UNIVERSITY RESEARCH CONSORTIUM TECHNO-PARK, Seoul (KR)

(*) Notice: Subject to any disclaimer, the term of this patent is extended or adjusted under 35 U.S.C. 154(b) by 78 days.

(21) Appl. No.: 14/375,137

(22) PCT Filed: Jan. 15, 2013

(86) PCT No.: PCT/KR2013/000302
§ 371 (c)(1),
(2) Date: Jul. 29, 2014

(87) PCT Pub. No.: WO2013/115505
PCT Pub. Date: Aug. 8, 2013

(65) Prior Publication Data
US 2014/0376279 A1   Dec. 25, 2014

(30) Foreign Application Priority Data
Jan. 30, 2012  (KR) .......................... 10-2012-0008864

(51) Int. Cl.
  *H02M 3/335* (2006.01)
  *G01R 15/18* (2006.01)
  *H02M 1/34* (2007.01)

(52) U.S. Cl.
  CPC ......... *H02M 3/33523* (2013.01); *G01R 15/185* (2013.01); *H02M 1/34* (2013.01); *H02M 2001/346* (2013.01)

(58) Field of Classification Search
  CPC ............ H02M 3/33523; H02M 3/335; H02M 2001/346; H02M 1/34; G01R 15/185; C08L 83/10; Y02B 70/1491
  USPC ........ 363/21.15; 336/195, 170, 182; 335/172, 335/18
  See application file for complete search history.

(56) References Cited

U.S. PATENT DOCUMENTS

| 5,053,695 A | 10/1991 | Canter |
| 6,288,551 B1 | 9/2001 | Zabler et al. |

(Continued)

FOREIGN PATENT DOCUMENTS

| JP | 05-322935 A | 12/1993 |
| JP | 11-502313 A | 2/1999 |

(Continued)

*Primary Examiner* — Jessica Han
*Assistant Examiner* — Demetries A Gibson
(74) *Attorney, Agent, or Firm* — Revolution IP, PLLC

(57) ABSTRACT

Disclosed is a power estimation device using a coaxial winding transformer which includes: a switching control unit that generates primary current by performing switching control on power source; a coaxial winding transformer that includes a core, and a primary winding, a secondary winding, and an auxiliary winding which are wound on the core and outputs secondary current in accordance with the winding ratio of the secondary winding to the primary winding by receiving the primary current; and a power estimation unit that estimates power outputted to the secondary winding by sensing output of the auxiliary winding in accordance with the winding ratio of the auxiliary winding to the primary winding, in which the coaxial winding transformer is formed by winding a cable, which uses at least inner conductor as the secondary winding and uses one outer conductor surrounding the inner conductor as the auxiliary winding, around the core.

7 Claims, 6 Drawing Sheets

(56) References Cited

U.S. PATENT DOCUMENTS

| | | | | |
|---|---|---|---|---|
| 6,445,268 | B1* | 9/2002 | Daum | H01H 71/2481 335/172 |
| 7,796,005 | B2* | 9/2010 | Blankenship | H05H 1/36 219/130.1 |
| 7,834,613 | B2 | 11/2010 | Ziegler et al. | |
| 8,269,592 | B1* | 9/2012 | McCauley, IV | H01F 27/28 336/175 |
| 2002/0033748 | A1* | 3/2002 | Bolotinsky | H01F 30/16 336/182 |
| 2003/0011445 | A1* | 1/2003 | Heumann | H03H 7/06 333/167 |
| 2009/0184681 | A1* | 7/2009 | Kuno | B60K 6/445 320/128 |
| 2009/0290390 | A1* | 11/2009 | Piper | H02M 3/33507 363/21.04 |
| 2010/0123429 | A1* | 5/2010 | Chen | H02J 7/025 320/108 |
| 2010/0178550 | A1* | 7/2010 | Kasmer | H01M 10/123 429/160 |
| 2014/0340938 | A1* | 11/2014 | Park | H01F 27/2823 363/15 |

FOREIGN PATENT DOCUMENTS

| | | |
|---|---|---|
| JP | 11-511087 A | 9/1999 |
| JP | 2011-502261 A | 1/2011 |
| KR | 10-2002-0074203 A | 9/2002 |

* cited by examiner

POWER ESTIMATION DEVICE USING COAXIAL WINDING TRANSFORMER

CROSS REFERENCE TO PRIOR APPLICATIONS

This application is a National Stage Application of PCT International Patent Application No. PCT/KR2013/000302 filed on Jan. 15, 2013, under 35 U.S.C. §371, which claims priority to Korean Patent Application No. 10-2012-0008864 filed on Jan. 20, 2012, which are all hereby incorporated by reference in their entirety.

TECHNICAL FIELD

The present invention relates to a power estimation device using a coaxial winding transformer, and more particularly, to a technology of indirectly estimating power of a secondary side by minimizing leakage inductance.

BACKGROUND ART

In most of applications of power switch, there is a need of electric insulation between the input and the output to protect a user from a danger of an accident due to high voltage or leakage current. A high-frequency transformer is used for the insulation and this converter is called an 'isolated DC-DC converter'. The transformer adjusts the magnitude of the output voltage, using the winding ratio of the primary and secondary cables, other than insulating. A flyback converter, a forward converter, a push-pull converter, a half-bridge converter, and a full-bridge converter are typical isolated converters. The flyback converter and the forward converter are generally used for small power circuits under hundreds of watts.

The low-priced converters of the related art use indirect measurement that senses output voltage or current at the primary side of a transformer and estimate secondary (output) information, using an auxiliary winding wound around the same core wound with a primary winding and a secondary winding. However, leakage inductance is caused by poor combination of the primary winding, the secondary winding, and the auxiliary winding, so there is a problem in that it is difficult to accurately sense the output voltage or current.

On the other hand, the transformers for minimizing leakage inductance in the related art have large thicknesses because they have several pieces of inner conductors connected in parallel, such that not a solenoid winding type, but a loop winding type is used and it is wound on a toroidal core that is a ring-shaped magnetic core. Transformers having this structure have been generally used only for large capacity due to the high manufacturing cost and the coupling coefficient is not high because the inner conductors are not twisted.

The background art of the present invention has been described in Korean Patent Application Publication No. 2002-0074203 (2002 09 28).

DISCLOSURE

Technical Problem

An object of the present invention is to provide a technology of minimizing leakage inductance between an auxiliary winding and a secondary winding, when indirectly estimating output applied to a secondary winding of a transformer, using an auxiliary winding.

Technical Solution

A power estimation device using a coaxial winding transformer according to an embodiment of the present invention includes: a switching control unit that generates primary current by performing switching control on power source; a coaxial winding transformer that includes a core, and a primary winding, a secondary winding, and an auxiliary winding which are wound on the core and outputs secondary current in accordance with the winding ratio of the secondary winding to the primary winding by receiving the primary current; and a power estimation unit that estimates power outputted to the secondary winding by sensing output of the auxiliary winding in accordance with the winding ratio of the auxiliary winding to the primary winding, in which the coaxial winding transformer is formed by winding a cable, which uses at least one inner conductor as the secondary winding and uses one outer conductor surrounding the inner conductor as the auxiliary winding, around the core.

A power estimation device using a coaxial winding transformer according to another embodiment of the present invention includes: a switching control unit that generates primary current by performing switching control on power source; a coaxial winding transformer that includes a core, and a primary winding, a secondary winding, and an auxiliary winding which are wound on the core and outputs secondary current in accordance with the winding ratio of the secondary winding to the primary winding by receiving the primary current; and a power estimation unit that estimates power outputted to the secondary winding by sensing output of the auxiliary winding in accordance with the winding ratio of the auxiliary winding to the primary winding, in which the coaxial winding transformer is formed by winding a cable, which uses at least one inner conductor as the auxiliary winding and uses one outer conductor surrounding the inner conductor as the secondary winding, around the core.

Further, when the cable includes a plurality of inner conductors, the primary winding, the secondary winding, and the auxiliary winding may be made of one cable, using at least one of the inner conductors as the primary winding.

Furthermore, when the cable includes a plurality of inner conductors, a first longitudinal end or a second longitudinal end of any one of the inner conductors may be connected in series with a second longitudinal end or a first longitudinal end of another inner conductor.

In addition, the number of the inner conductors may be determined in consideration of the winding ratios of the primary winding and the secondary winding, and the primary winding and the auxiliary winding.

In addition, the cable may be wound around the core in a solenoid winding type or a toroidal winding type.

In addition, the switching control unit may perform PWM control for turning on/off the power source.

In addition, the power estimation unit may control switching of the switching control unit by comparing the estimated power outputted to the secondary winding with predetermined secondary winding power.

Advantageous Effects

As described above, when the power estimation device using a coaxial winding transformer according to the present invention indirectly estimates power applied to a secondary winding of a transformer, using an auxiliary winding, it is possible to minimize leakage inductance by forming the auxiliary winding and the secondary winding using one cable and it is possible to accurately estimate the secondary power.

MODE FOR INVENTION

Hereinafter, embodiments of the present invention are described with reference to the accompanying drawings. The terms used herein are terms selected in consideration of the functions in the embodiments and their meanings may depend on the intention of users and workers or precedents. Therefore, the meanings of the terms used in the following embodiments follow the definitions, if defined specifically herein, or should be construed as the meanings that those skilled in the art know, if not defined specifically.

Figure 1:
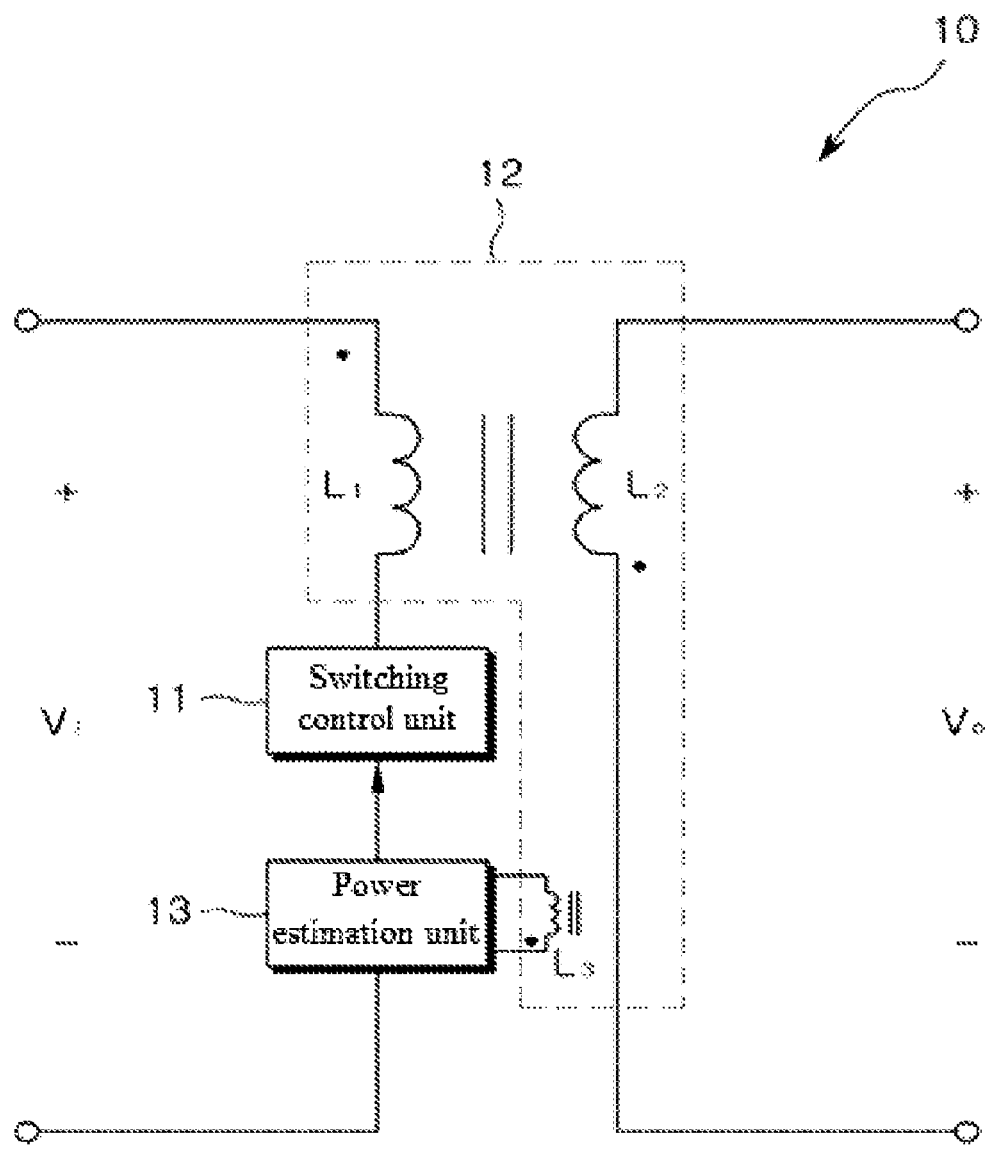
FIG. 1 is a view illustrating the configuration of a power estimation device using a coaxial winding transformer according to an embodiment of the present invention.

FIG. 1 is a view illustrating the configuration of a power estimation device using a coaxial winding transformer according to an embodiment of the present invention.

Referring to FIG. 1, a power estimation device 10 includes a switching control unit 11, a coaxial winding transformer 12, and a power estimation unit 13. The switching control unit 11 includes a switch (not illustrated) and a control module (not illustrated) and generates primary current by performing switching control on power source. In this configuration, the switching control unit 11 can generate primary current by performing PWM control on the switch.

In the coaxial winding transformer 12, a primary inductor L1, a secondary inductor L2, and an auxiliary inductor L3 are connected in a predetermined winding ratio. In detail, the structure of the coaxial winding transformer 12 includes a core, a primary winding, a secondary winding, and an auxiliary winding and outputs secondary current in accordance with the winding ratio of the secondary winding to the primary winding, which are wound around the core, by receiving primary current. In this case, an inner conductor or an outer conductor may be achieved from one cable of the secondary winding and the auxiliary winding. Further, the primary winding, the secondary winding, and the auxiliary winding may be achieved from one cable.

The power estimation unit 13 senses current or voltage outputted to the auxiliary winding and estimates the power outputted to the secondary winding, using the winding ratio of the primary winding, the secondary winding, and the auxiliary winding. For example, when primary current is applied to the primary winding of the coaxial winding transformer 12 through the switching control unit 11, secondary current is outputted to the secondary winding in accordance with the winding ratio of the primary winding and the secondary winding. Auxiliary current is outputted to the auxiliary winding composed of the secondary winding and one cable in accordance with the winding ratio of the primary winding and the auxiliary winding. The power estimation unit 13 estimates power outputted to the secondary winding by measuring auxiliary current or auxiliary voltage, compares the estimated value with a predetermined power value, and determines that the power outputted from the secondary winding is normal, when the estimated value is within a normal error range for the predetermined power value. However, when the estimated power value is out of the normal effort range for the power value, it controls the switching control unit 11 to control the output value of the secondary winding.

As described above, when the power estimation device 10 using a coaxial winding transformer according to the present invention estimates power applied to the secondary winding of the coaxial winding transformer 12, using the auxiliary winding, it is possible to minimize leakage inductance by forming the auxiliary winding and the secondary winding using one cable and it is possible to indirectly but accurately estimate the secondary power by measuring the power of the auxiliary winding.

On the other hand, in a power estimation device 10 according to another embodiment of the present invention, a switching power converter may implemented by further including an output unit (not illustrated) that outputs the secondary current from the secondary winding as a load by smoothing it.

Figure 2:
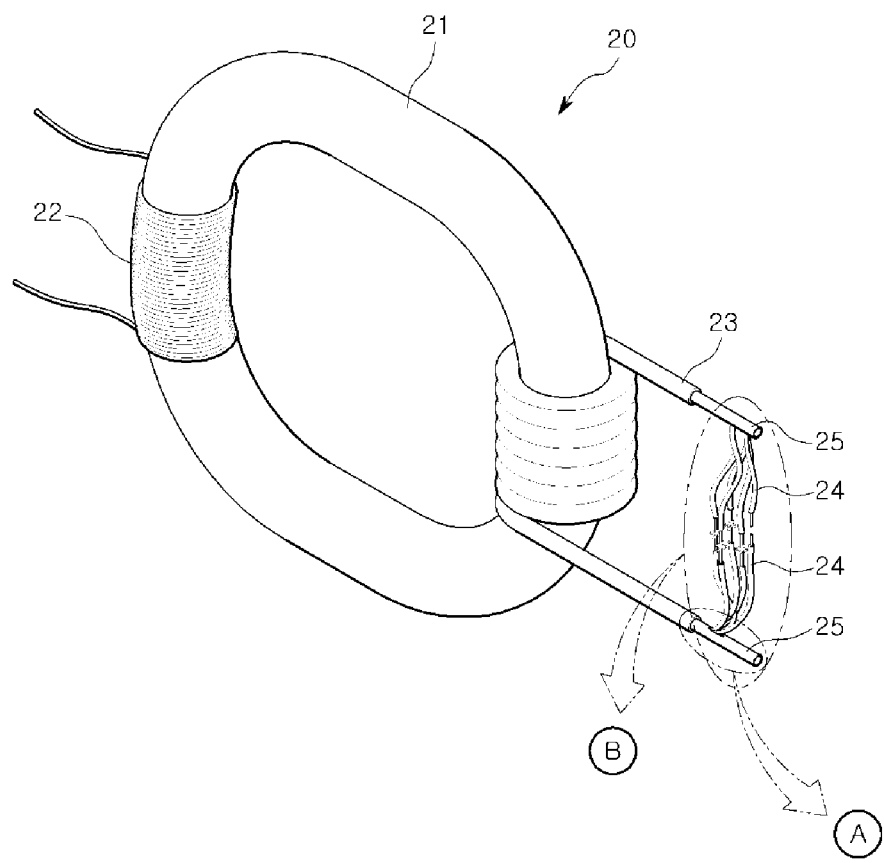
FIG. 2 is an exemplary view illustrating a case of using a toroidal core in a coaxial winding transformer included in the power estimation device illustrated in FIG. 1.
Figure 3:
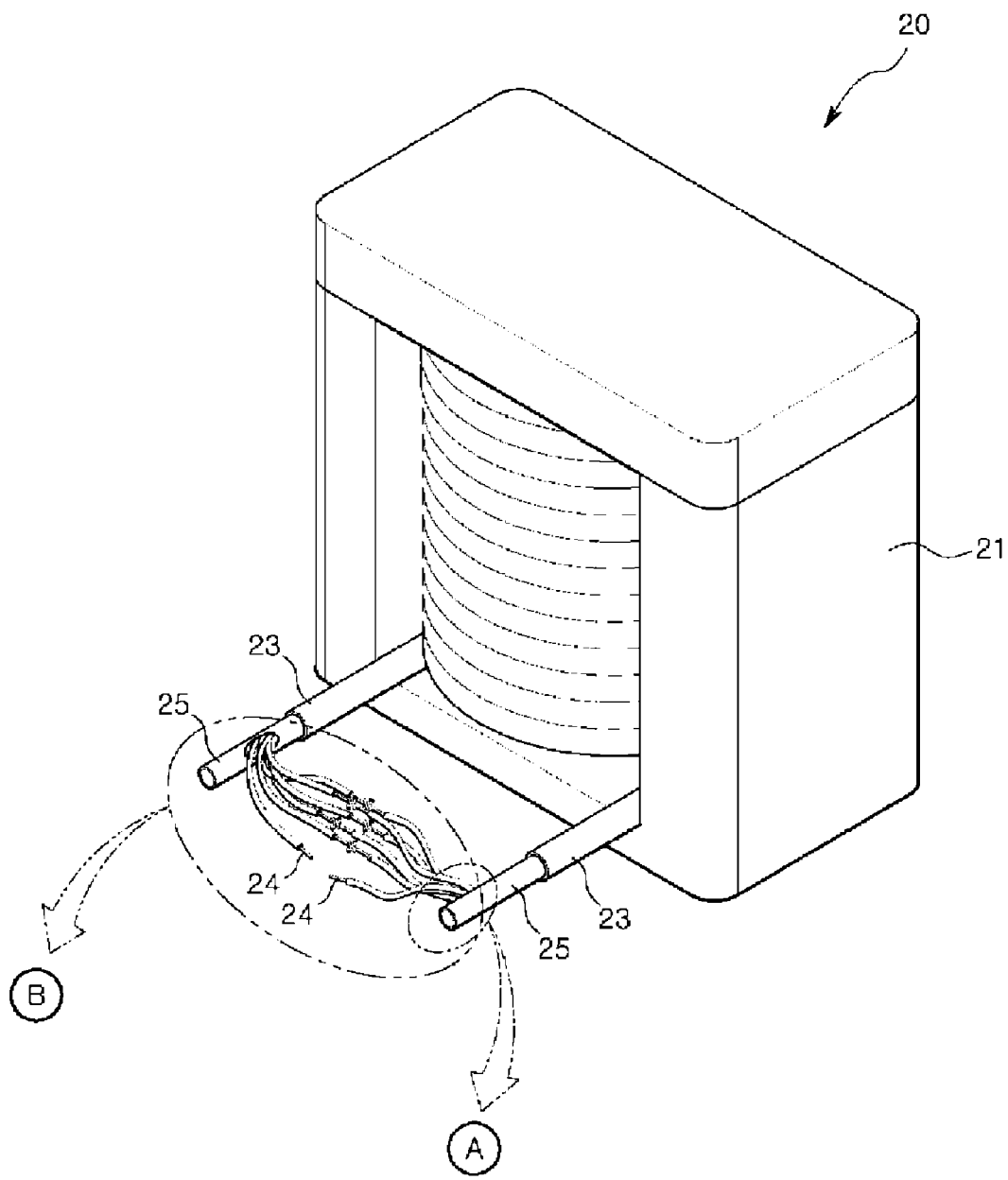
FIG. 3 is an exemplary view illustrating a case of using an E-type core and an I-type core in a coaxial winding transformer included in the power estimation device illustrated in FIG. 1.

FIG. 2 is an exemplary view illustrating a case of using a toroidal core in a coaxial winding transformer included in the power estimation device illustrated in FIG. 1 and FIG. 3 is an exemplary view illustrating a case of using an E-type core and an I-type core in a coaxial winding transformer included in the power estimation device illustrated in FIG. 1.

Referring to FIG. 2, a coaxial winding transformer 20 according to an embodiment of the present invention includes a core 21, a primary winding 22, a secondary winding 24, and an auxiliary winding 25. The coaxial winding means a coaxial cable with a single core and a multiple core wound on a core. The core 21 is a magnetic material and a circular toroidal core may be used. The primary winding 22 means a coil corresponding to the primary side of the coaxial winding transformer 20 and wound on the core 21 and the secondary winding 24 means a coil corresponding to the secondary side of the coaxial winding transformer 20 and wound on the core 21. The auxiliary winding 25 is an auxiliary winding used for estimating output at the secondary winding.

In this configuration, the secondary winding 24 and the auxiliary winding 25 may be made of one cable 23 and the cable 23 may be wound on a toroidal core in a solenoid winding type. That is, at least one inner conductor may be the secondary winding 24 and one outer conductor surrounding at least one inner conductor may be the auxiliary winding 25. Alternately, the outer conductor may be the auxiliary winding and the inner conductor may be the secondary winding 24.

In FIG. 2, the primary wire 22 is disposed at a side of the core 21 and the cable 23 including the secondary winding 24 and the auxiliary winding 25 is connected to the other side. Since the secondary winding 24 and the auxiliary winding 25 are achieved by one cable 23, it is possible to minimize leakage inductance between the secondary winding 24 and the auxiliary winding 25. It is possible to improve accuracy in estimating current or voltage that is the output value applied to the secondary winding 24 by measuring the output at the auxiliary winding 25.

Further, when the cable 23 includes a plurality of inner conductors, it is possible to form the primary winding 22, the secondary winding 24, and the auxiliary winding 25, using one cable 23, by using at least one of the inner conductors for the primary winding 22. For example, some of the inner conductors may be used for the primary winding 22, the other inner conductors may be used for the secondary winding 24, and the outer conductor may be used for the auxiliary winding 25. The number of inner conductors may be set in consideration of the winding ratios of the primary winding 22 and the secondary winding 24, and the primary winding 22 and the auxiliary winding 25. Further, the plurality of inner conductors may extend to N-th winding, depending on the setting by a user.

Referring to FIG. 3, the coaxial winding transformer 30 may use a core 31 formed by combining an E-type core and an I-type core, in which the transformer may be achieved by winding a cable 33 on the center leg of the E-type core. In this configuration, it is possible to achieving the primary winding, the secondary winding 34, and the auxiliary winding 35, using one cable 33. That is, the inner conductors may be different windings.

The configuration of the cable will be described in detail below with reference to FIGS. 4 and 5.

Figure 4:
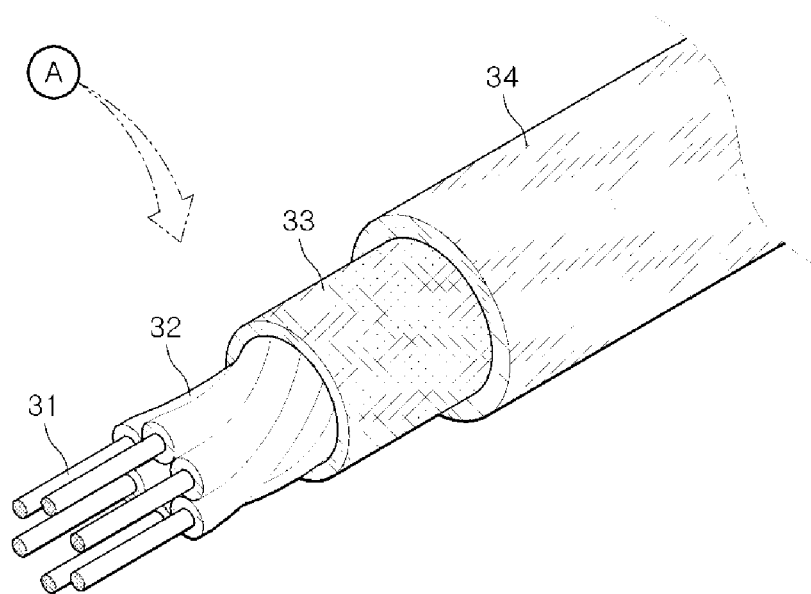
FIG. 4 is a view illustrating the internal configuration of a cable used in the coaxial winding transformer illustrated in FIG. 2 or 3.
Figure 5:
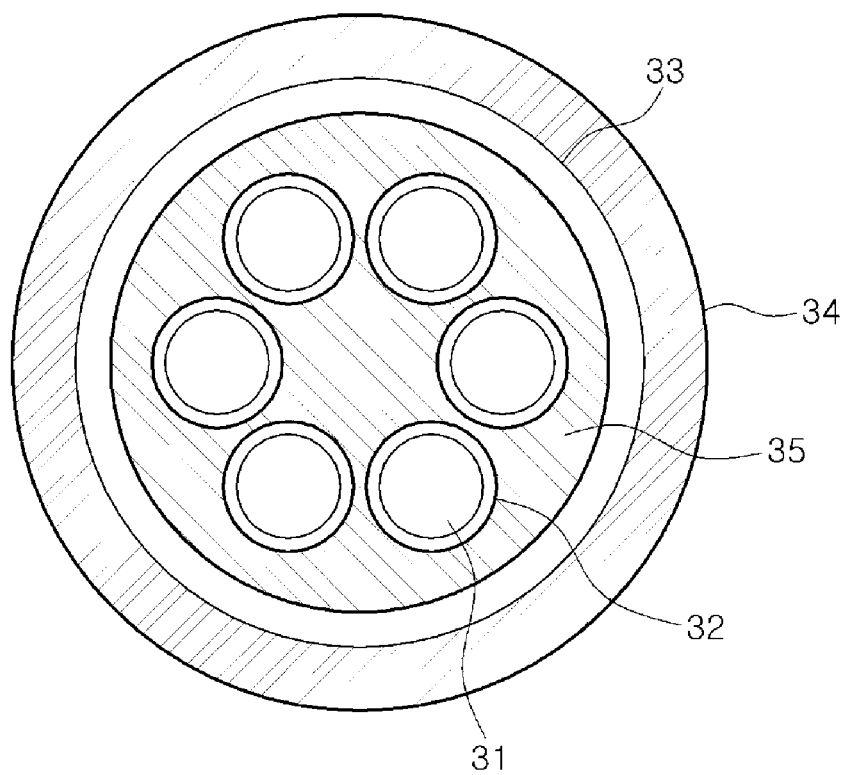
FIG. 5 is a cross-sectional view of the cable illustrated in FIG. 3.

FIG. 4 is a view illustrating the internal configuration of a cable used for the coaxial winding transformer illustrated in FIG. 2 or 3 and FIG. 5 is a cross-sectional view of the cable illustrated in FIG. 3.

Referring to FIGS. 4 and 5, a cable 34 is respectively composed of a plurality of inner conductors 31, coatings 32 covering the inner conductors 31, and an outer conductor 33 covering the inner conductors 31. As described above, the inner conductors 31 and the outer conductor 33 may be the primary winding, the secondary winding, and the auxiliary winding, depending on the setting by a user. A transformer with excellent coupling can be achieved by increasing the combination coefficient, by reducing the gaps between the primary winding, the secondary winding, and the auxiliary winding. In this case, it is possible to make the combination coefficient close to 100% by using the cable 34 including the inner conductors 31, which are formed by twisting several pieces of thin enamel wires, and the outer conductor 33 coated with a conductive material. Further, an insulator 32 of FIG. 4 and 35 of FIG. 5 may be disposed between the inner conductors 31 and the outer conductor 33.

Further, the turn ratios of the primary winding and the secondary winding, and the primary winding and the auxiliary winding of the transformer can be varied by forming the inner conductors 31 by twisting several pieces of thin enamel wires coated with enamel and connecting the inner conductors 31 in series at the ends. For example, when the inner conductors 31 wound around the core are the primary winding and the secondary winding, respectively, and the outer conductor 33 is auxiliary winding, for the structure of the cable 34, the magnetic flux by the primary current is fully linked to the secondary winding and auxiliary winding, so it is possible to minimize influence of the leakage inductance due to the auxiliary winding.

Accordingly, the coaxial winding transformer according to an embodiment of the present invention, unlike the related art, uses the type of connecting in series the ends of the inner conductors 31 formed by twisting several pieces of thin enamel wires and of winding them on a single or a pair of cores in the solenoid winding or toroidal winding type. Here, it is required to firmly wind the windings in the coaxial winding transformer in order to minimize the influence by leakage inductance. Since the enamel wires are thin conductive wires, they can be wound more densely than the existing coaxial cables, so coupling is firm and thus the influence by leakage inductance can be minimized.

On the other hand, when the cable 34 include a plurality of inner conductors 31, the first longitudinal end or the second longitudinal end of any one of the inner conductors 31 can be connected in series with the second longitudinal end or the first longitudinal end of the other one of the inner conductors 31. For example, when the inner conductors 31 are the secondary windings and the outer conductors 33 are the auxiliary windings in the cable 34, the inner conductors 31 each have cut-off first longitudinal end and second longitudinal end. In this configuration, it is possible to increase the number of winding the secondary winding on the core by connecting the first longitudinal end and the second longitudinal end of other inner conductor 31.

Longitudinal end connection of inner conductors is described hereafter with reference to FIG. 4.

Figure 6:
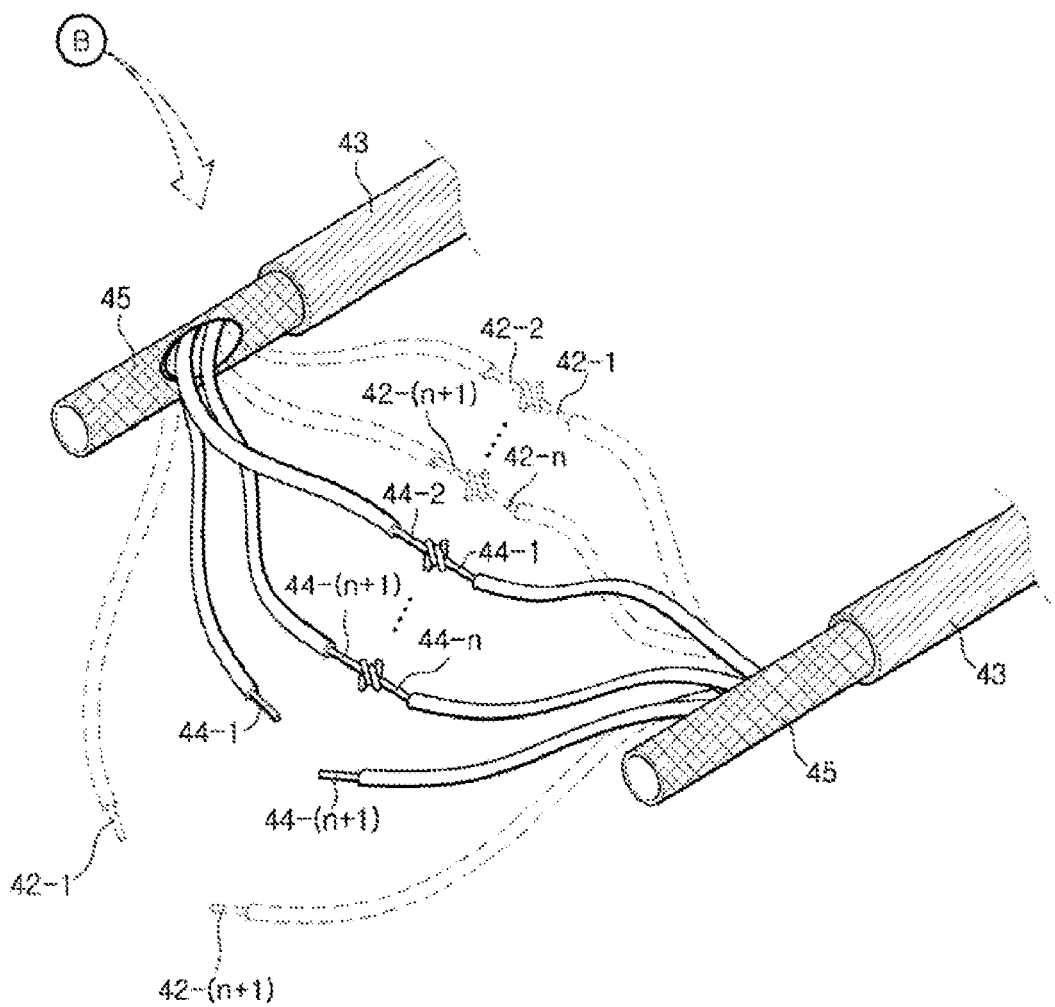
FIG. 6 is an exemplary view illustrating longitudinal end connection of cables used in the coaxial winding transformer illustrated in FIG. 2 or 3.

FIG. 6 is an exemplary view illustrating longitudinal end connection of cables used in the coaxial winding transformer illustrated in FIG. 2 or 3.

Referring to FIG. 6, the cable 43 is one continuous wire and an outer conductor 45 in the cable 43 is also one continuous wire. When there is a plurality of inner conductors 42-1, 42-2, 42-n, 42-(n+1) and 44-1, 44-2, 44-n, 44-(n+1) covered by the outer conductor 45, the inner conductors 42 and 44 are electrically insulated from each other. The longitudinal ends of the inner conductors 42 and 44 are connected in series in order to connect the insulated inner conductors 42 and 44. In this configuration, the longitudinal end of one of the inner conductors is connected with the longitudinal end of the other inner conductor. For example, the longitudinal end of the first inner conductor 42-1 is connected with the longitudinal end of the second inner conductor 42-2. When the longitudinal ends of n+1 inner conductors are connected with each other in this way, it is possible to achieve an effect like connecting an inner conductor, which is n+1 times longer than a single inner conductor, to a core. One longitudinal end of the first inner conductor 44-1 and one longitudinal end of the n+1 inner conductor 44-(n+1) may be open.

Further, when the inner conductors 42 and 44 are different wires, the short longitudinal end between the inner conductors 42 and 44 may further extend. For example, when a primary winding and a secondary winding are achieved by the inner conductors 42 and 44 and an auxiliary winding is achieved by the outer conductor 45, one longitudinal end of the inner conductor 42-1 corresponding to the primary winding and one longitudinal end of the inner conductor 42-1 corresponding to the secondary winding keep short-connection. Accordingly, in one cable, the inner conductor 42 corresponding to the primary winding and the inner conductor 44 corresponding to the secondary winding may be individually formed.

As described above, when the power estimation device using a coaxial winding transformer according to the present invention estimates the power applied to a secondary winding of a transformer, using an auxiliary winding, it is possible to minimize the leakage inductance by forming the auxiliary winding and the secondary winding using one cable and it is possible to accurately estimate the secondary power.

Although the present invention has been described on the basis of the embodiments described with reference to the drawings, it is not limited thereto. Therefore, the present invention should be construed on the basis of claims intended for including modifications that can be achieved apparently from the embodiments.

The invention claimed is:
1. A power estimation device using a coaxial winding transformer, comprising:
   a switching control unit configured to generate primary current by performing switching control on a power source;
   a coaxial winding transformer including a core, a primary winding, a secondary winding, and an auxiliary winding that are wound on the core, the coaxial winding transformer configured to output secondary current in accor- dance with the winding ratio of the secondary winding to the primary winding based on the primary current; and a power estimation unit configured to determine power outputted to the secondary winding by sensing output of the auxiliary winding in accordance with winding ratio of the auxiliary winding to the primary winding, the primary winding having a coil wound on a first side of the core and the auxiliary winding wound on a second side of the core, the first side and the second side being opposite each other, wherein the coaxial winding transformer is formed by winding a cable around the core in which at least one a plurality of inner conductors is used as the secondary winding and an outer conductor surrounding the at least one of the plurality of inner conductors is used as the auxiliary winding.

2. The power estimation device of claim 1, wherein when the cable includes a plurality of inner conductors, at least one of the plurality of inner conductors is used as the primary winding, and the primary winding, the secondary winding, and the auxiliary winding are made of one cable.

3. The power estimation device of claim 1, wherein when the cable includes the plurality of inner conductors, a first longitudinal end or a second longitudinal end of a first inner conductor among the plurality of inner conductors is connected in series with a second longitudinal end or a first longitudinal end of a second inner conductor among the plurality of inner conductors.

4. The power estimation device of claim 1, wherein a number of the inner conductors are determined by determining winding ratio of the primary winding to the secondary winding, and winding ratio of the primary winding to the auxiliary winding.

5. The power estimation device of claim 1, wherein the cable is wound on the core in a solenoid winding type or a toroidal winding type.

6. The power estimation device of claim 1, wherein the switching control unit configured to perform PWM control for turning on/off the power source.

7. The power estimation device of claim 1, wherein the power estimation unit is configured to control switching of the switching control unit by comparing estimated power outputted to the secondary winding with predetermined secondary winding power.

* * * * *